US011280477B2

(12) United States Patent
Kubo et al.

(10) Patent No.: US 11,280,477 B2
(45) Date of Patent: Mar. 22, 2022

(54) LIGHT SOURCE DEVICE AND LIGHTING DEVICE

(71) Applicant: KYOCERA Corporation, Kyoto (JP)

(72) Inventors: Yoshinori Kubo, Omihachiman (JP); Kazuyoshi Fujimoto, Yasu (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/296,146

(22) PCT Filed: Nov. 22, 2019

(86) PCT No.: PCT/JP2019/045870
§ 371 (c)(1),
(2) Date: May 21, 2021

(87) PCT Pub. No.: WO2020/110962
PCT Pub. Date: Jun. 4, 2020

(65) Prior Publication Data
US 2022/0018519 A1  Jan. 20, 2022

(30) Foreign Application Priority Data
Nov. 26, 2018  (JP) .............................. JP2018-220457

(51) Int. Cl.
*F21V 9/32* (2018.01)
*F21V 29/502* (2015.01)
(Continued)

(52) U.S. Cl.
CPC .............. *F21V 9/32* (2018.02); *F21V 29/502* (2015.01); *F21K 9/64* (2016.08); *F21S 41/176* (2018.01);
(Continued)

(58) Field of Classification Search
CPC ..... F21Y 2109/00; F21S 43/16; F21S 41/176; F21K 9/64; F21V 9/30; F21V 9/32; F21V 9/35
See application file for complete search history.

(56) References Cited

U.S. PATENT DOCUMENTS

| | | | | |
|---|---|---|---|---|
| 2011/0157865 A1 * | 6/2011 | Takahashi | ............... | F21S 41/16 362/84 |
| 2012/0236536 A1 * | 9/2012 | Harada | .................. | F21S 41/176 362/84 |

(Continued)

FOREIGN PATENT DOCUMENTS

| | | | | |
|---|---|---|---|---|
| DE | 102015220948 A1 * | 4/2017 | ............ | F21S 41/176 |
| JP | 2013-254690 A | 12/2013 | | |

(Continued)

*Primary Examiner* — Alexander K Garlen
*Assistant Examiner* — Colin J Cattanach
(74) *Attorney, Agent, or Firm* — Procopio Cory Hargreaves and Savitch LLP

(57) ABSTRACT

A light source device of the present disclosure includes a sapphire plate having a first surface and a second surface facing each other, a wavelength conversion material located opposite the first surface of the sapphire plate, and a first excitation light source emitting a first excitation light having directivity to the wavelength conversion material through the second surface, in which an angle between the first surface and the second surface, and a c-axis of sapphire is greater than 80°, and an angle between the c-axis and an optical axis of the first excitation light is 20° or more. A lighting device of the present disclosure includes the light source device and a light guide member.

10 Claims, 10 Drawing Sheets

(51) Int. Cl.
  *F21S 43/16* (2018.01)
  *F21V 9/35* (2018.01)
  *F21V 9/30* (2018.01)
  *F21S 41/176* (2018.01)
  *F21Y 109/00* (2016.01)
  *F21K 9/64* (2016.01)

(52) U.S. Cl.
  CPC ............ *F21S 43/16* (2018.01); *F21V 9/30* (2018.02); *F21V 9/35* (2018.02); *F21Y 2109/00* (2016.08)

(56) References Cited

U.S. PATENT DOCUMENTS

2014/0340918 A1* 11/2014 Suckling ............... F21V 9/08
 362/510
2018/0347785 A1  12/2018 Kawaguchi et al.

FOREIGN PATENT DOCUMENTS

| WO | WO-2012019767 A2 * | 2/2012 | ............ F21K 9/64 |
| WO | 2017/038164 A1 | 3/2017 | |
| WO | WO-2017038164 A1 * | 3/2017 | ............ F21S 41/24 |

* cited by examiner

LIGHT SOURCE DEVICE AND LIGHTING DEVICE

TECHNICAL FIELD

The present disclosure relates to a light source device and a lighting device.

BACKGROUND ART

In recent years, lighting devices using LEDs and semiconductor lasers (LDs) as light sources have begun to be used in applications such as headlights for vehicles. A light source device used in this lighting device generates white light directly or indirectly by converting wavelength from excitation light irradiated on a wavelength conversion material such as a fluorescent body. By irradiating this white light in the desired direction using a reflector and lens, the lighting device has a larger amount of light than conventional lighting devices.

The conversion efficiency of this wavelength conversion material is not 100%, and a part of the energy of the irradiated excitation light becomes heat. For this reason, a holding plate that holds the wavelength conversion material is required to have heat dissipation performance in addition to light transmitting.

Sapphire has high light transmittance and thermal conductivity, which makes it a superior material for the holding plate. For example, Patent Documents 1 and 2 describe a light source device and a lighting device that includes a laser light source, a fluorescent body, and a sapphire plate holding the fluorescent body, and provide an example of irradiating a laser beam perpendicular to the sapphire plate.

PRIOR ART DOCUMENTS

Patent Documents

Patent Document 1: Japanese Unexamined Patent Publication No. 2013-254690
Patent Document 2: International Publication No. 2017/038164

SUMMARY OF THE INVENTION

Problem to be Solved by the Invention

In such a light source device, if the amount of light is further increased, the heating value of the wavelength conversion material increases, and the heat may cause the wavelength conversion material to deteriorate. Furthermore, stress caused by the temperature difference between a heated part and its outer region may damage the wavelength conversion material. The present disclosure aims to provide a light source device and lighting device that are less prone to performance degradation and damage due to heat.

Means for Solving the Problem

The light source device of the present disclosure includes a sapphire plate having a first surface and a second surface facing each other, a wavelength conversion material located opposite the first surface of the sapphire plate, and a first excitation light source that emits a first excitation light having directivity to the wavelength conversion material through the second surface. An angle between the first surface and the second surface, and a c-axis of sapphire is greater than 80°, and an angle between the c-axis and an optical axis of the first excitation light is 20° or more.

The lighting device of the present disclosure includes the light source device and a light guide member.

Effects of the Invention

According to the present disclosure, it is possible to provide a light source device and a lighting device that are less prone to performance degradation and damage due to heat.

EMBODIMENTS FOR CARRYING OUT THE INVENTION

Figure 1:
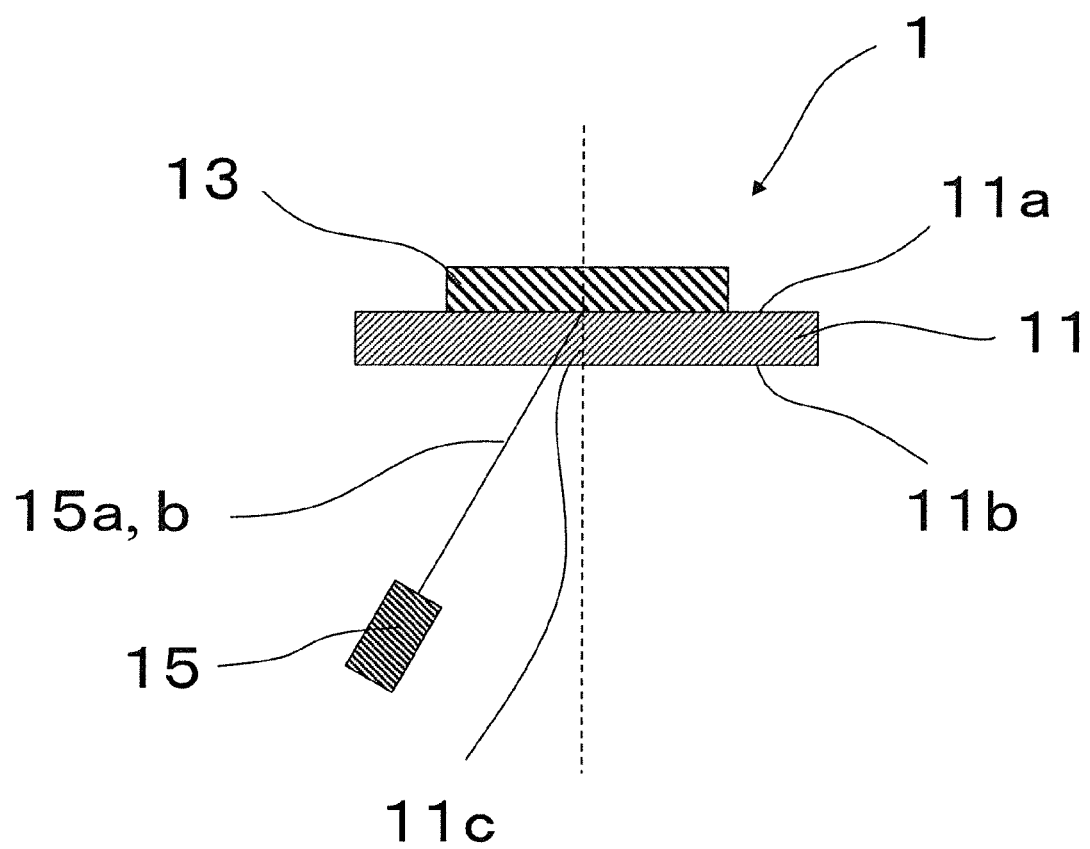
FIG. 1 is a sectional schematic view of the light source device according to the first embodiment.
Figure 2A:
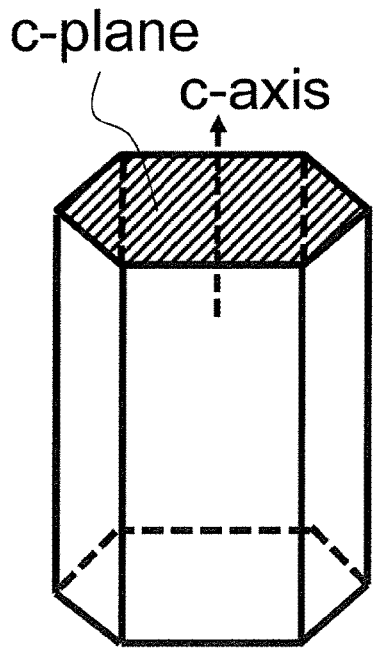
FIG. 2(a), FIG. 2(b), FIG. 2(c), and FIG. 2(d) are schematic diagrams illustrating a crystal structure of sapphire.
Figure 2B:
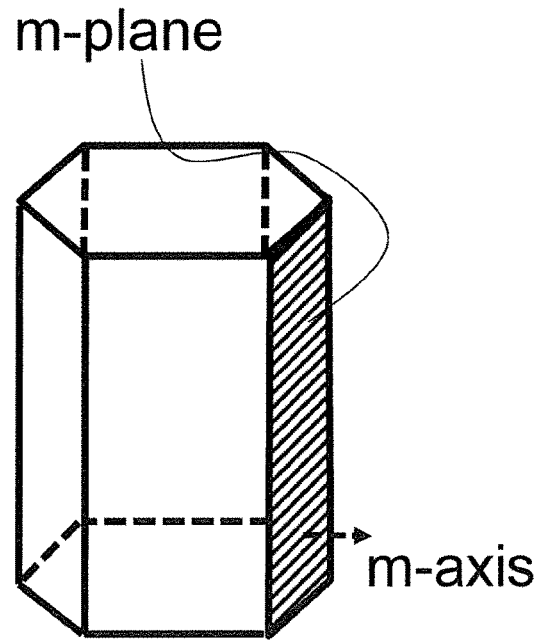
Figure 2C:
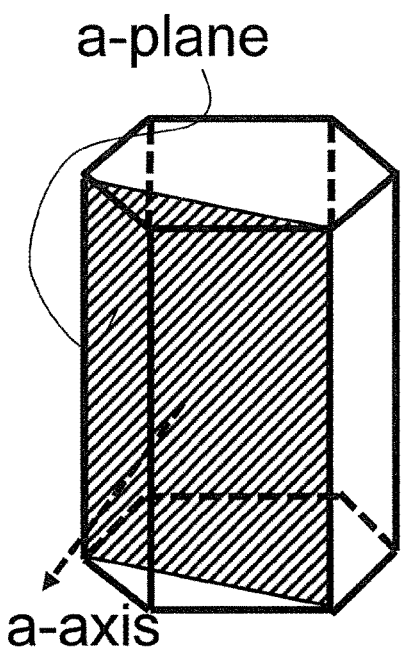
Figure 2D:
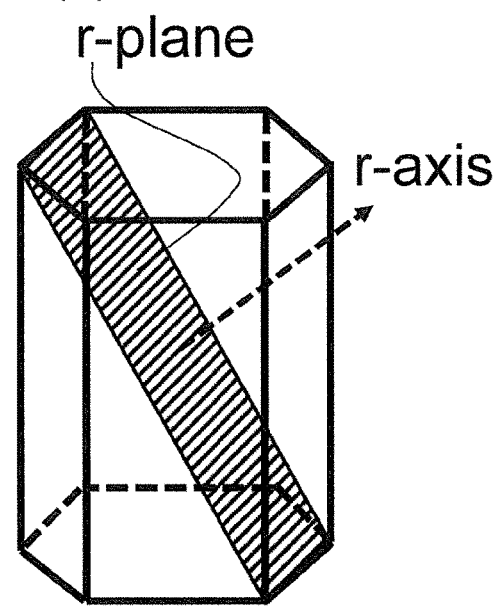

The light source device of the present disclosure and the lighting device using it are described with reference to the figures. FIG. 1 is a sectional schematic view of a light source device 1 according to the first embodiment.

The light source device 1 of the present disclosure includes a sapphire plate 11 having a first surface 11a and a second surface 11b facing each other. Sapphire is a single crystal of aluminum oxide (chemical formula $Al_2O_3$). As illustrated in FIG. 2(a), FIG. 2(b), FIG. 2(c) and FIG. 2(d), sapphire has typical crystal planes such as a c-plane, m-plane, a-plane, and r-plane. A crystal orientation of the sapphire plate 11 can be identified using an X-ray diffractometer. As the X-ray diffractometer, for example, an automatic X-ray crystal orientation measurement device (model 2991F2) manufactured by Rigaku Corporation can be used.

The light source device 1 of the present disclosure includes a wavelength conversion material 13 located opposite to the first surface 11a of the sapphire plate 11. The light source device 1 of the present disclosure includes a first light source 15 that emits a first excitation light 15a having directivity. The first excitation light 15a is irradiated to the wavelength conversion material 13 through the second surface of the sapphire plate 11. The wavelength conversion material 13 converts the wavelength of the irradiated first excitation light 15a, and for example, makes it white light for lighting.

An angle between the first surface 11a and the second surface 11b and the c-axis of sapphire is between 0° and 90°, reaching a maximum of 90° when orthogonal to the c-axis. For the sapphire plate 11 in the light source device 1 of the present disclosure, the angle between the first surface 11a and the second surface 11b, and the c-axis of sapphire is greater than 80°, and even more preferably greater than 85°. In other words, the inclination of the first surface 11a and the second surface 11b of the sapphire plate 11 from the c-plane of sapphire is less than 10°, and even more preferably less than 5°. This inclination can be 0°. That is, the first surface 11a and the second surface 11b (main surface) of the sapphire plate 11 may be parallel to the c-plane of sapphire, or the main surface may be the c-plane.

If the first excitation light 15a passes through the sapphire plate 11 and is irradiated to the wavelength conversion material 13, the temperature of the wavelength conversion material 13 and the sapphire plate 11 increases by a part of energy of the first excitation light 15a. Since the sapphire plate 11 is a plate shape, the length in the planar direction is longer than the length in the thickness direction. Accordingly, the dimensional change in the planar direction is larger than that in the thickness direction. Therefore, if the thermal expansion coefficient in the planar direction is the same, it is possible to suppress the detachment of the wavelength conversion material 13 from the sapphire plate 11 and damage to the wavelength conversion material 13 caused by the thermal expansion difference in the planar direction.

The thermal expansion coefficients of sapphire at 40° C. to 400° C. are $7.7 \times 10^{-6}/°$ C. in the direction parallel to the c-axis of sapphire and $7.0 \times 10^{-6}/°$ C. in the direction perpendicular to the c-axis. Thus, sapphire is a material that has an anisotropy in the thermal expansion coefficient.

Sapphire has the same thermal expansion coefficient in any direction perpendicular to the c-axis. Therefore, if the angle between the first surface 11a and the second surface 11b of the sapphire plate 11, and the c-axis of sapphire is set to a range greater than 80°, and even more preferably greater than 85°, the thermal expansion coefficient difference that occurs in the planar direction can be reduced.

In the light source device 1 of the present disclosure, the angle between a c-axis 11c of the sapphire plate 11 and an optical axis 15b of the first excitation light 15a is 20° or more. In other words, as shown in FIG. 1, the first excitation light 15a is incident on the second surface 11b of the sapphire plate 11 at an inclination of 20° or more.

Sapphire is a crystal having birefringent properties. Birefringence refers to the fact that when light rays pass through a material, they are divided into two types, normal light and abnormal light, depending on their state of polarization. The refractive index of the two types of light coincide when the light travels coaxially with the optical axis (c-axis) 11c of the sapphire plate 11, and the light is not split into two. On the other hand, if the direction of light is not coaxial with an optical axis 11c of the sapphire plate 11, the refractive index of normal light does not depend on the angle of light with respect to the optical axis. However, the refractive index of the abnormal light varies depending on the angle of the light with respect to the optical axis 11c.

Figure 3:
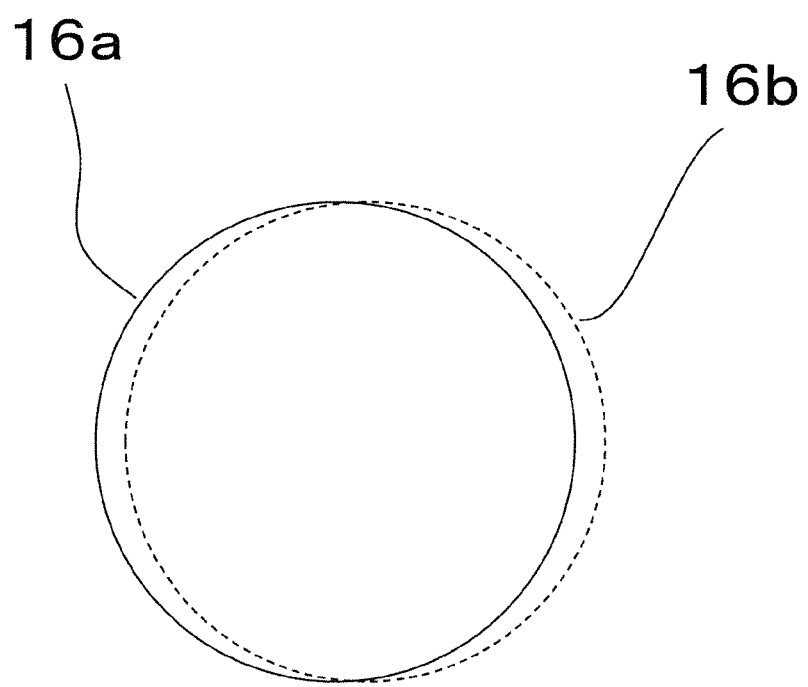
FIG. 3 is a schematic diagram illustrating the misalignment of normal light and abnormal light.

For example, if the cross-sectional shape of the excitation light 15a perpendicular to the optical axis 15b is circular, and if the excitation light 15a is not coaxial with the optical axis 11c of the sapphire plate 11, the excitation light 15a, which is circular in cross-sectional shape perpendicular to the optical axis 15b, splits into a normal light 16a indicated by solid line and an abnormal light 16b by dashed line in the process of passing through the sapphire plate 11, as shown in FIG. 3, and the two circles are overlapped, approximately forming an elliptical shape.

At this time, the amount of light is higher in a region that includes both the normal light 16a and the abnormal light 16b than in a region that includes only the normal light 16a and in a region that includes only the abnormal light 16b. Therefore, a region having a low amount of light is disposed outside a region having a high amount of light. Furthermore, a region where the first excitation light 15a is not irradiated exists outside of the region having the low amount of light.

The higher the amount of light, the greater the heating value of the wavelength conversion material 13, and therefore, in the light source device 1 of the present disclosure, a region having a low heating value is disposed outside a region having a high heating value. A region where the first excitation light 1a is not irradiated and no heat is generated exists outside of it. The region where light is not irradiated is a region that transfers and radiates the heat generated by the irradiation of light, resulting in a temperature difference between a region where the light hits and a region outside of it. The steeper this temperature difference is, the greater the strain caused by thermal expansion in the wavelength conversion material 13 and the sapphire plate 11.

In the light source device 1 of the present disclosure, the first excitation light 15a can be divided into the normal light 16a and the abnormal light 16b by using the birefringent property of the sapphire plate 11. Therefore, by disposing the region having a low heating value outside the region having a high heating value, the temperature difference that occurs in the wavelength conversion material 13 and the sapphire plate 11 can be relatively gradual. As a result, the wavelength conversion material 13 can be suppressed from detaching from the sapphire plate 11.

The misalignment between the normal light 16a and the abnormal light 16b using this birefringent property changes depending on the angle between the optical axis 15b of the first excitation light 15a and the c-axis 11c of the sapphire plate 11 and the incident angle. Light entering the second surface 11b of the sapphire plate 11 from the air at an incident angle θa is refracted at an interface between the air and the sapphire plate 11 (second surface 11b), and propagates through the sapphire plate 11 at a refraction angle θb. When the refractive index of the sapphire plate 11 is N, according to the Snell's law, $\sin\theta a/\sin\theta b=N$. Using this relationship, it is possible to calculate the misalignment between the normal light 16a and the abnormal light 16b.

Figure 10:
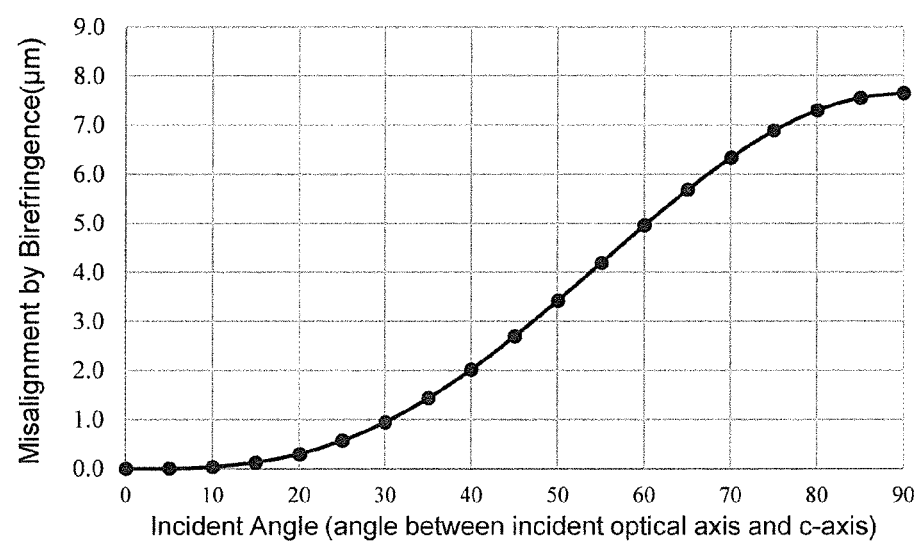
FIG. 10 is a graph illustrating the misalignment of normal light and abnormal light in the first surface.

For example, when the first excitation light 15a having a wavelength of 488 nm (the refractive index of the normal light is 1.775 and the refractive index of the abnormal light is 1.767 to 1.775) is incident on the second surface 11b of a sapphire plate 11 whose main surface is the c-plane having a thickness of 3.0 mm, the misalignment at the first surface 11a due to the difference in the refractive index between the normal light 16a and the abnormal light 16b is illustrated in FIG. 10. In FIG. 10, the refractive index of the abnormal light was approximately calculated to vary in an elliptical arc shape from 1.767 to 1.775, depending on the incident angle θa.

The misalignment is 0 when the incident angle θa is 0°, and becomes larger as the incident angle θa increases, reaching to 0.3 μm at the incident angle θa of 20°, 2.0 μm at 40°, and 15.3 μm at 90°. If the angle between the c-axis 11c and the optical axis 15b of the first excitation light 15a is 20° or more, and more preferably 40° or more, the misalignment due to the difference in refractive index between the normal light 16a and the abnormal light 16b becomes larger, and performance degradation and damage due to heat is less likely to occur.

The incident angle of the first excitation light 15a to a second surface 11b may be 75° or less. The incident angle is 0° when the first excitation light 15a is incident perpendicular to the second surface 11b.

Figure 4:
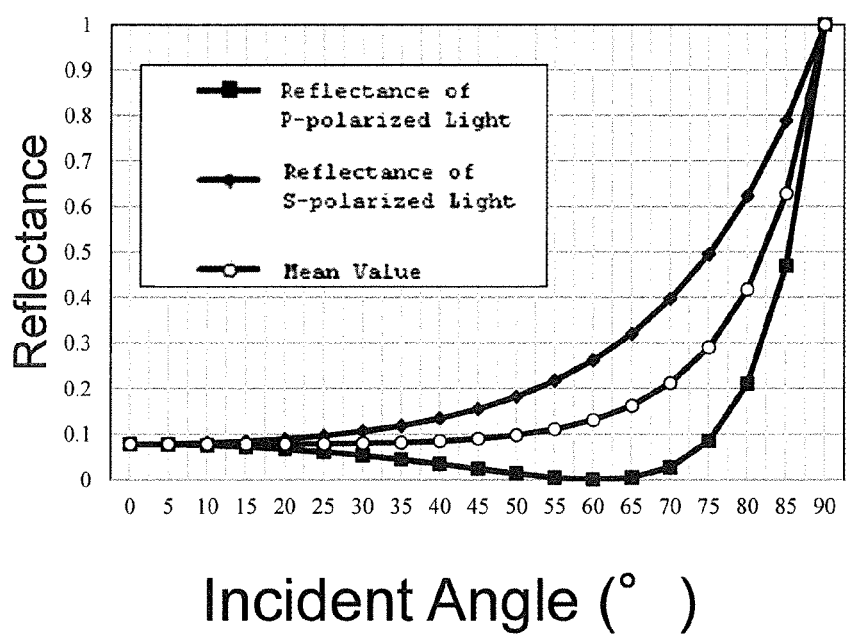
FIG. 4 is a graph illustrating the relationship between the incident angle and the reflectance of the excitation light to the main surface of the sapphire plate.

As illustrated in FIG. 4, the ratio that the first excitation light 15a is reflected on the second surface 11b changes depending on the incident angle of the first excitation light 15a to the second surface 11b. The portion of the first excitation light 15a that is reflected does not contribute to the emission of light. That is, the larger the reflectance, the lower the luminous efficiency, and thus the less reflection is required.

The graph in FIG. 4 shows the calculated relationship between the incident angle and the reflectance of the first excitation light 15a having the wavelength of 488 nm on the second surface 11b when the surface of the sapphire plate 11 is a mirror surface. Since the difference in the refractive index between the normal light 16a and the abnormal light 16b is small, this graph is calculated using only the refractive index of the normal light 16a. The abnormal light 16b is ignored.

The graph illustrates the reflectance of P-polarized light and the reflectance of S-polarized light, and the mean value of the reflectance of P-polarized light and the reflectance of S-polarized light. If the first excitation light 15a is natural light that is not polarized, the relationship between the incident angle and the reflectance of the first excitation light 15a to the second surface 11b is indicated by the mean value of the reflectance of the P-polarized light and the reflectance of the S-polarized light.

In the region where the incident angle of the first excitation light 15a to the second surface 11b is 75° or less, the reflectance of both S-polarized light and P-polarized light is relatively small. Thus, if the incident angle of the first excitation light 15a to the second surface 11b is set to 75° or less, the reflection of the first excitation light 15a on the second surface 11b can be suppressed and the luminous efficiency can be increased. When the first excitation light 15a is P-polarized, the reflectance is small. Therefore, if the incident angle is set to 85° or less, the reflection of the first excitation light 15a on the second surface 11b can be suppressed, and the luminous efficiency can be increased. If the incident angle of the first excitation light 15a to the second surface 11b is set to 55° or less, the reflectance can be further reduced. When the first excitation light 15a is P-polarized, the reflectance is small. Therefore, if the incidence angle is set to 75° or less, the reflection of the first excitation light 15a on the second surface 11b can be suppressed, and the luminous efficiency can be increased.

Considering the misalignment of the normal light 16a and the abnormal light 16b and the fact that the first excitation light 15a is reflected on the second surface 11b, the incident angle of the first excitation light 15a to the second surface 11b may be in the range of 40 to 55°. If the first excitation light 15a is P-polarized, the incidence angle may be in the range of 40 to 75°.

In the light source device 1 of the present disclosure, the optical axis 15b of the first excitation light 15a is irradiated diagonally to the second surface 11b of the sapphire plate 11. Therefore, even if the first excitation light 15a is reflected on the second surface 11b, the reflected light can be avoided from irradiating the first light source 15. As a result, damage to the first light source 15 can be suppressed.

Figure 5:
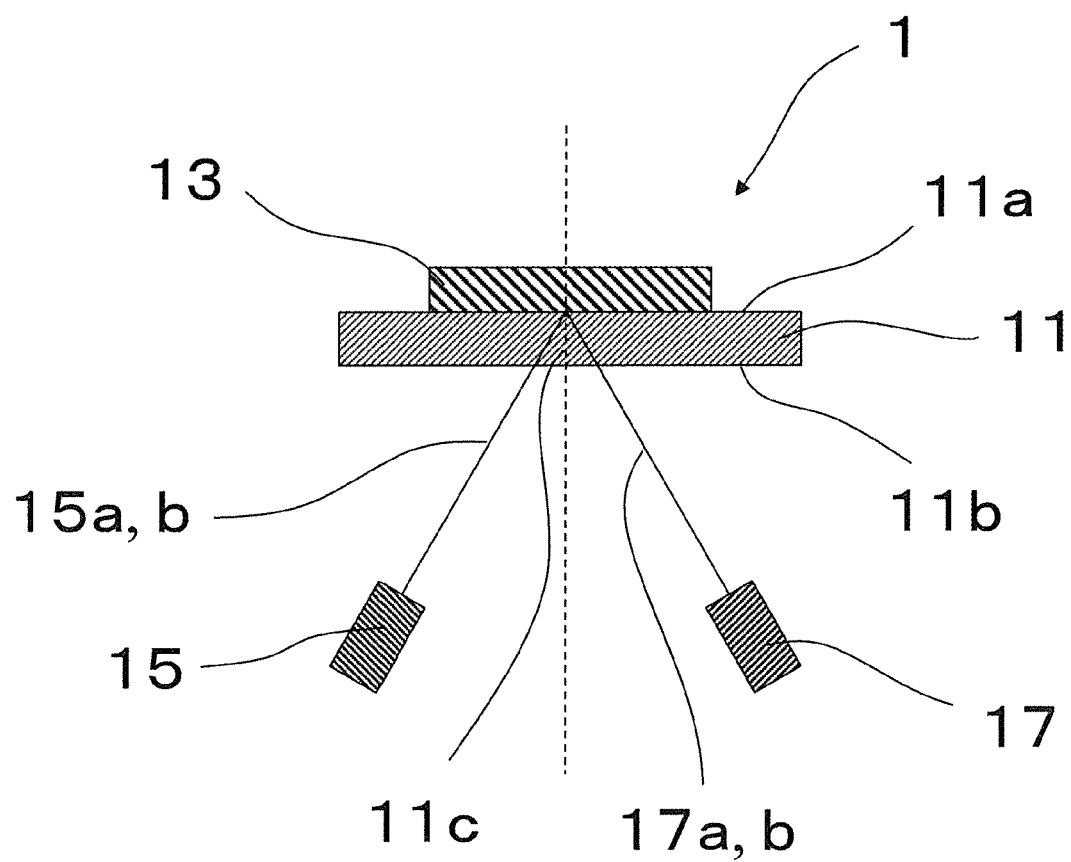
FIG. 5 is a sectional schematic view of the light source device according to the second embodiment.

As in the second embodiment illustrated in FIG. 5, a second excitation light source 17 may be further provided to irradiate the second excitation light 17a having directivity to the wavelength conversion material 13 through the second surface 11b of the sapphire plate 11. In this way, having a plurality of excitation light sources 15 and 17 can increase the amount of light of the light source device 1. The desired amount of light can be obtained even when combining the first and second excitation light sources 15 and 17 which have relatively small amount of light.

This second excitation light 17a may be disposed so as to overlap the first excitation light 15a at least partially with the wavelength conversion material 13. If the excitation light overlaps each other, the area of the wavelength conversion material 13 can be reduced. If the area of the wavelength conversion material 13 can be made smaller, the area of contact between the wavelength conversion material 13 and the sapphire plate 11 becomes smaller. When the thermal expansion coefficients of both are different, the smaller the contact area between them, the smaller the stress caused by the thermal expansion difference, and it is possible to suppress the detachment of the wavelength conversion material 13 from the sapphire plate 11.

Figure 6:
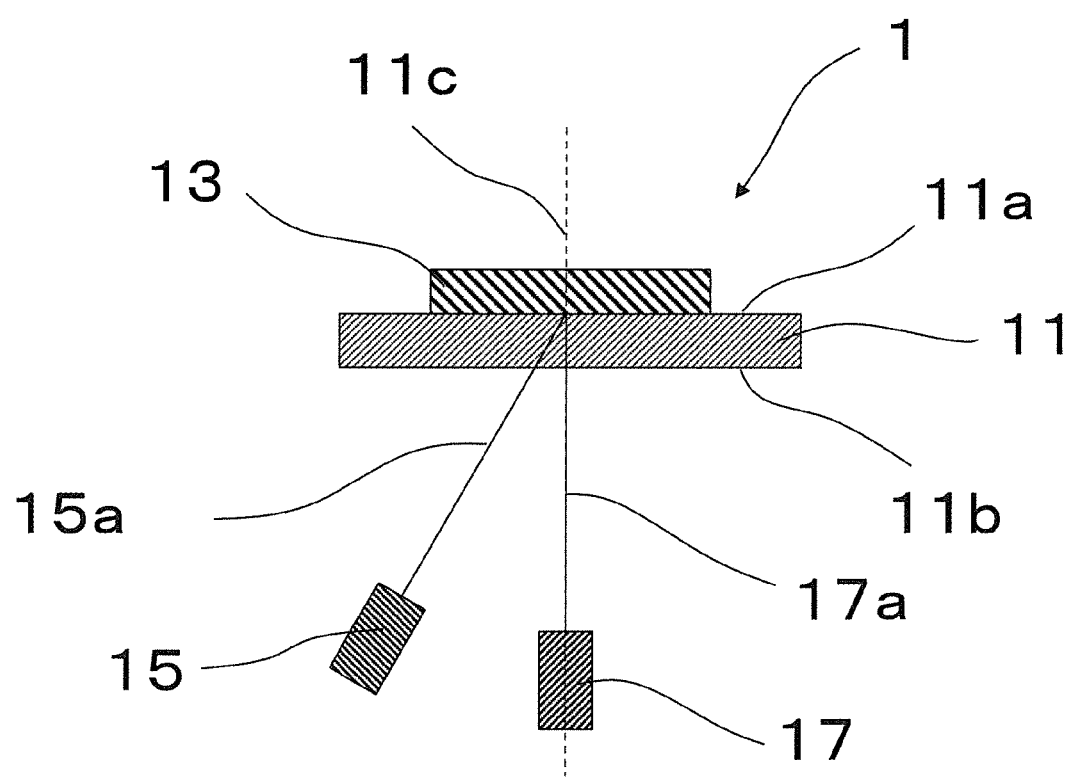
FIG. 6 is a sectional schematic view of the light source device according to the third embodiment.

When the light source device 1 has a plurality of excitation light sources 15 and 17, the angle between the c-axis 11c and the optical axis 15b of the first excitation light 15a and the angle between the c-axis 11c and the optical axis 17b of the second excitation light 17a may be the same, as illustrated in FIG. 5, or they may be different, as in the third embodiment illustrated in FIG. 6.

If the angle between the c-axis 11c and the optical axis 15b of the first excitation light 15a is different from the angle between the c-axis 11c and the optical axis 17b of the second excitation light 17a, it is possible to change the size of the region where only the normal light and the abnormal light are irradiated by the first excitation light 15a and the second excitation light 17a. Therefore, these can be combined to design the distribution of the amount of light as appropriate. As illustrated in FIG. 6, if the angle between the optical axis 15b of the first excitation light 15a and the c-axis 11c is 20° or more, the angle between the optical axis 17b of the second excitation light 17a and the c-axis may be 0°.

Figure 7:
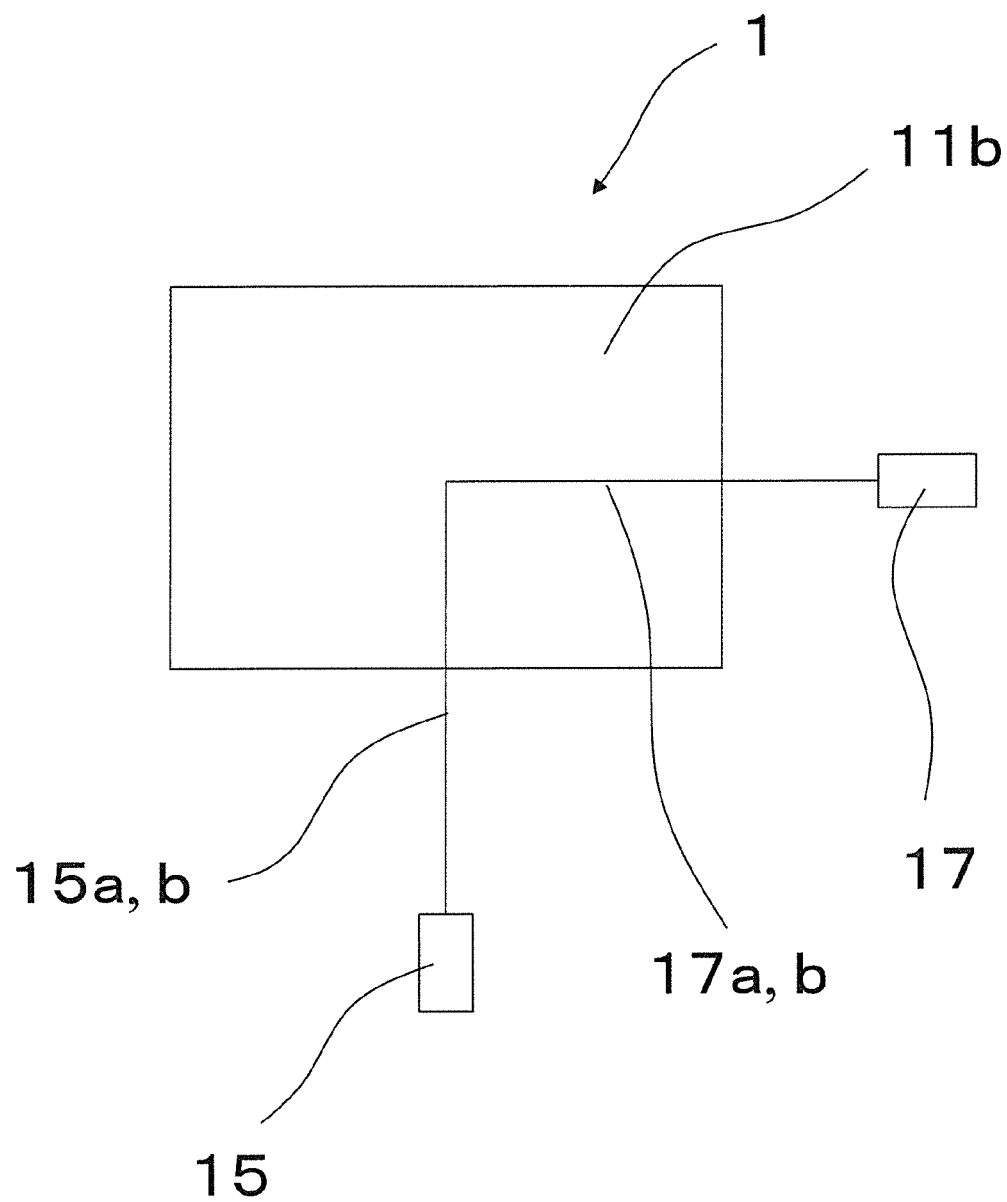
FIG. 7 is a schematic view in the upper surface view of the light source device according to the fourth embodiment.

When viewed from a direction perpendicular to the second surface 11b of the sapphire plate 11, the angle between the optical axis 15b of the first excitation light 15a and the optical axis 15b of the second excitation light 17a may be in the range of 1° or more and 179° or less. For example, as in the fourth embodiment illustrated in FIG. 7, if the angle between the optical axis 15b of the first excitation light 15a and the optical axis 15b of the second excitation light 17a is set to 90°, which is in the range of 80° to 100°, so that the first excitation light 15a and the second excitation light 17a overlap with the wavelength conversion material 13, it is possible to dispose regions where only the normal light and only the abnormal light are irradiated in both the left-right and up-down directions. As a result, the temperature difference can be made more gradual.

Figure 8:
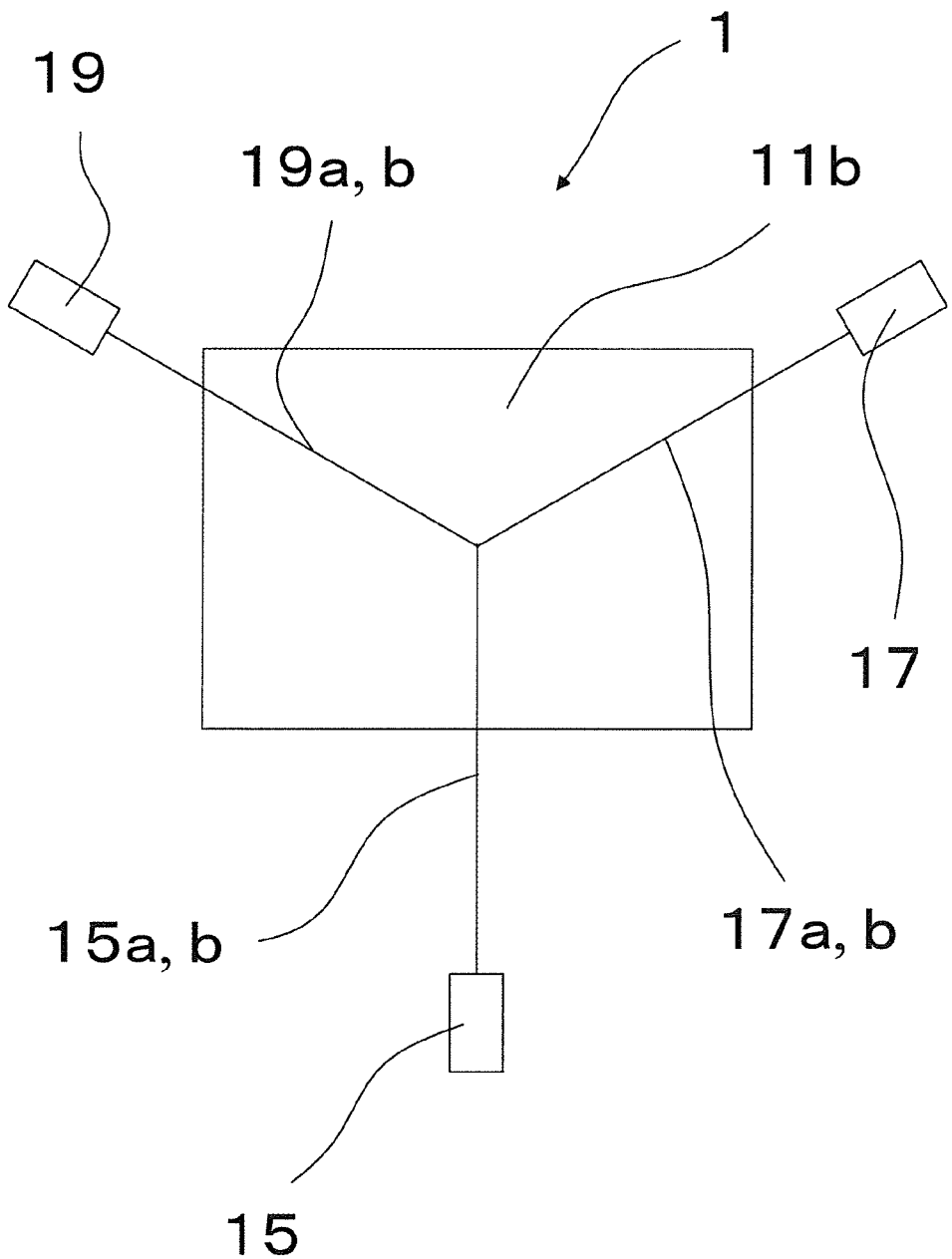
FIG. 8 is a schematic view in the upper surface view of the light source device according to the fifth embodiment.

The light source device 1 of the present disclosure may further have a third excitation light source 19 that emits a third excitation light 19a having directivity, as in the fifth embodiment illustrated in FIG. 8. With this configuration, the amount of light from the light source device 1 can be further increased. When viewed from a direction perpendicular to the second surface 11b, the optical axes 15b, 17b, and 19b of the first excitation light 15a, the second excitation light 17a, and the third excitation light 19a, respectively, may be projected onto the second surface 11b with the same angle between each of them, and the angle between them may be 120°. With this configuration, the angles between the optical axes of the excitation light 15a, 17a, and 19a irradiated on the wavelength conversion member 13 can be made equally spaced. As a result, the distribution of the temperature difference can be made regular.

In the light source device 1, the optical axis 15b of the first excitation light 15a and the optical axis 17b of the second excitation light 17a may be disposed in an asymmetrical direction with respect to the irradiation position on the second surface 11b of the sapphire plate 11, that is, the plurality of excitation light sources 15a and 17a may be disposed so as not to irradiate the total reflection light of one to the other. This can suppress damage to the excitation light sources 15 and 17 by irradiating them to other excitation light sources 15 and 17, even if the excitation light 15a and 17a are reflected by the sapphire plate 11.

In the light source device 1 of the present disclosure, the excitation light sources 15, 17, and 19 may be laser light sources. The laser beam emitted from the laser light source has high directivity and high output, so that the output of the light source device 1 can be increased. The excitation light sources 15, 17, and 19 may be LEDs, or deformable optical fibers may be used to guide the excitation light. This configuration allows more flexibility in the design of the light source device 1. In both cases, the heat source can be separated by separating the wavelength conversion material 13, which is the heat source, from the excitation light sources 15, 17, and 19, making it easier to dissipate heat.

If the thickness of the sapphire plate 11 is 0.2 mm or more, it can have sufficient mechanical strength as a holding member of the wavelength conversion material 13. In particular, if the thickness of the sapphire plate 11 is 1 mm or more, it is less likely to be deformed or damaged by localized heat generation due to laser beam irradiation. If the thickness of the sapphire plate 11 is in the range of 2 mm or more and 4 mm or less, the heat dissipation can be increased. As the thickness of the sapphire plate 11 becomes thicker, the misalignment between the normal light 16a and the abnormal light 16b becomes larger. Therefore, if the thickness of the sapphire plate 11 is 2 mm or more, the misalignment of the normal light 16a and abnormal light 16b irradiated on the wavelength conversion material 13 can be made relatively large.

The angle between the axis perpendicular to the main surface of the sapphire plate 11 (the first surface 11a and the second surface 11b) and the c-axis 11c of the sapphire plate 11 may be 0.1° or more. In other words, the first surface 11a and the second surface 11b of the sapphire plate 11 may have an offset angle of 0.1° or more from the c-plane.

If the first surface 11a and the second surface 11b of the sapphire plate 11 have an offset angle of 0.1° or more from the c-plane, a step structure having a height of several Å and a width of several tens to several hundreds of Å is formed on the first surface 11a and the second surface 11b of the sapphire plate 11. The larger the offset angle, the larger the height of the step and the smaller the width. To increase the step structure, the offset angle may be set to 0.5° or more. With this configuration, a relatively large step structure is formed on the first surface 11a and the second surface 11b of the sapphire plate 11.

When the first surface 11a and the second surface 11b of the sapphire plate 11 have such a step structure, in the later described forming steps of an anti-reflection film, a dichroic film, and the wavelength conversion material 13, these films tend to be adsorbed at a step part. Therefore, uniform film formation is possible, and the anchor effect improves the adhesion between the sapphire plate 11 and the films. As a result, even if the sapphire plate 11 is repeatedly heated and cooled, the detachment of these films can be suppressed.

When the excitation light 15a has a blue wavelength of approximately 460 nm, for example, the step structure is sufficiently small compared to the wavelength so that the effect on the optical characteristics of the light source device 1 is suppressed to an imperceptible extent.

By applying heat treatment or plasma treatment as a pre-treatment for film formation on the surfaces of the first surface 11a and the second surface 11b of the sapphire plate 11, it is easy to generate a step structure having more uniform steps on the main surfaces 11a and 11b. By this step structure, the adhesion strength between the sapphire plate 11 and the film becomes high, and the variation of the adhesion strength becomes small. For example, as a pre-treatment, the sapphire plate 11 may be heat-treated at a temperature of 800° C. or higher, such as 1000° C. for approximately 3 hours.

The excitation light 15a may be focused to a diameter of approximately 0.5 mm or more and 3 mm or less, and irradiated onto the wavelength conversion material 13. In this way, by increasing the optical density of the excitation light 15a incident on the wavelength conversion material 13, a compact and highly luminous light source device 1 can be obtained. Furthermore, it is possible to make a lighting device with excellent design.

The light source device 1 may include the dichroic film (not shown) between the sapphire plate 11 and the wavelength conversion material 13, which transmits the excitation light 15a and reflects the wavelength conversion light. The second surface 11b of the sapphire plate 11 may include the anti-reflection film (not shown) that reduces the reflectance of the excitation light 15a. The dichroic film and the anti-reflection film can increase the luminous efficiency of the light source device 1.

The sapphire plate 11 and the wavelength conversion material 13 may be in direct contact or in indirect contact by putting the dichroic film or the like in between. The wavelength conversion material 13 is, for example, a fluorescent body. In particular, the wavelength conversion material 13 may be a ceramic fluorescent body, and this structure results in the light source device 1 having superior heat resistance.

Figure 9:
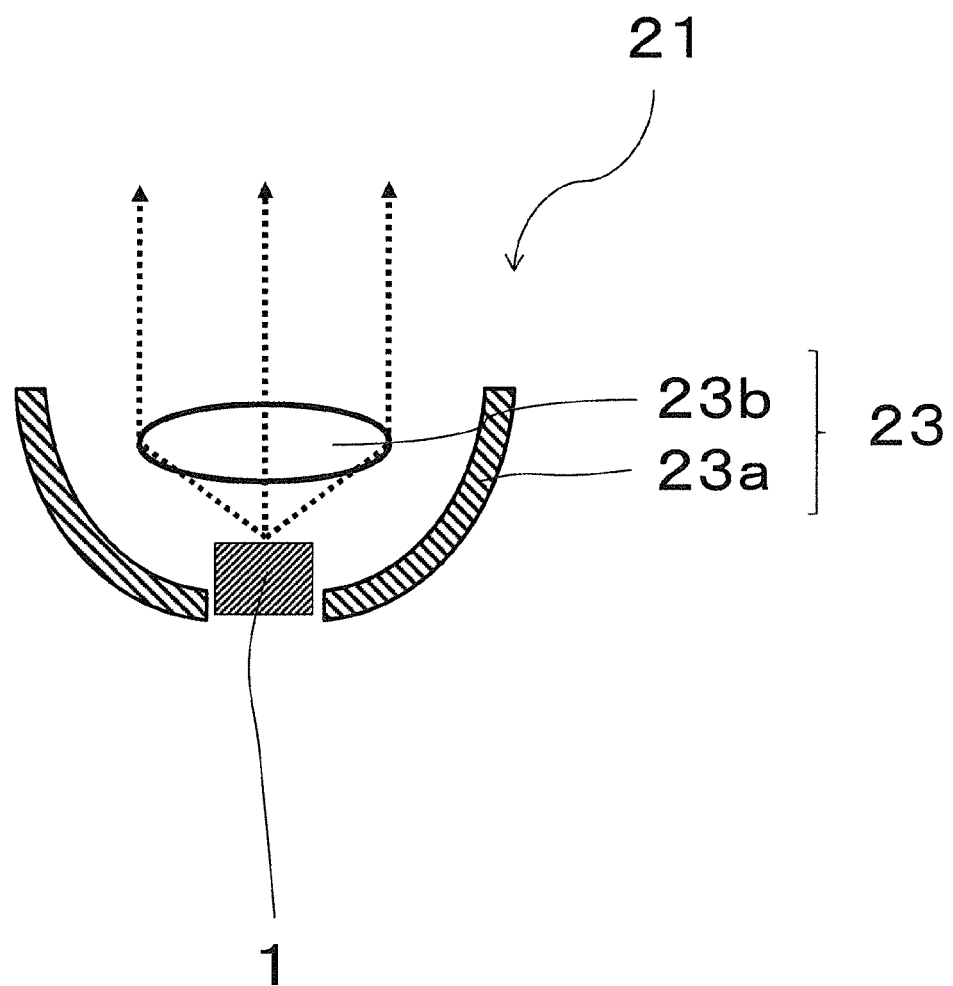
FIG. 9 is a sectional schematic view of the lighting device of the present disclosure.

As illustrated in FIG. 9, a lighting device 21 of the present disclosure has a reflector 23a and a lens 23b, which are a light guide member 23 guiding the light emitted by the light source device 1 of the present disclosure in a desired direction. In FIG. 9, the light source device 1 is described in a simplified form. The lighting device 21 of the present disclosure is suitable for spotlights and headlights for vehicles and other mobile bodies. Among the headlights for vehicles, driving headlights (so-called high beams) in particular are required to have the capability to identify obstacles in traffic at a distance of 100 m in front of them at night. The light source device 1 and the lighting device 21 of the present disclosure can suppress degradation of the wavelength conversion material 13 even at a high amount of light with an irradiation distance of 100 m or more, for example 600 m.

The light source device 1 may be designed so that the sapphire plate 11 is cooled by airflow. Cooling by airflow can be achieved by using an air blowing body such as a fan to air-cool the sapphire plate 11. The airflow generated by the movement of a mobile body, such as a vehicle, may be used. To improve the cooling effect, a cooling fin may be connected to the sapphire plate 11. The cooling fin may be formed on at least a part of the sapphire plate 11 other than the area where the light is irradiated.

If the sapphire plate 11 that attenuates light in a predetermined wavelength region, such as ultraviolet light, is used among the irradiated light, damage to the constituent members of the light source device 1, such as the first excitation light source 15, caused by external light can be suppressed. For example, the mean value of the transmittance of the sapphire plate 11 in the wavelength region of 200 to 400 nm may be smaller than the mean value of the transmittance in the wavelength region of 400 to 800 nm. When the sapphire plate 11 satisfies this configuration, it can attenuate light in the so-called ultraviolet light region and suppress damage to the first excitation light source 15 and the like by ultraviolet light contained in sunlight entering the lighting device 1.

The sapphire plate 11 may have an absorption band in the wavelength region of 205 to 260 nm. By controlling atmosphere during sapphire crystal growth or heat treatment after growth to a reducing atmosphere, and introducing defects caused by oxygen vacancies into sapphire, it is possible to produce sapphire that has the absorption band in the ultraviolet light region and can reduce ultraviolet light. Sapphire having defects caused by oxygen vacancies have defects called an F center and an F+ center. The F center has the absorption band at 205 nm, and the F+ center has absorption bands at 210 nm, 230 nm, and 260 nm. By using the sapphire plate 11 having the absorption band in the wavelength region of 205 nm to 260 nm, it is possible to attenuate the ultraviolet light that enters inside the light source device 1.

Thus, the light source device 1 of the present disclosure is suitable for the lighting device 21 for mobile bodies that are often exposed to external light such as sunlight. Mobile bodies are, for example, vehicles, and also include ships and airplanes.

Although the light source device 1 and the lighting device 21 using it of the present disclosure are described above, the present disclosure is not limited to the embodiments described above, and various improvements and changes may be made without departing from the scope of the present disclosure.

DESCRIPTION OF THE REFERENCE NUMERAL 1 light source device
11 sapphire plate
11a first surface
11b second surface
11c c-axis
13 wavelength conversion material
15 first excitation light source
15a first excitation light
15b optical axis of first excitation light
16a normal light
16b abnormal light
17 second excitation light source
17a second excitation light
17b optical axis of second excitation light
19 third excitation light source
19a third excitation light
19b optical axis of third excitation light
21 lighting device
23 light guide member
23a reflector
23b lens

The invention claimed is:

1. A light source device comprising:
   a sapphire plate having a first surface and a second surface facing each other,
   a wavelength conversion material located opposite the first surface of the sapphire plate, and
   a first excitation light source emitting a first excitation light having directivity to the wavelength conversion material through the second surface, wherein
   an angle between the first surface and the second surface, and a c-axis of sapphire is greater than 80°, and
   an angle between the c-axis and an optical axis of the first excitation light is 20° or more.

2. The light source device according to claim 1, wherein an angle between the c-axis and an optical axis of the first excitation light is 40° or more.

3. The light source device according to claim 1, wherein an incident angle of the first excitation light to the second surface is 75° or less.

4. The light source device according to claim 3, wherein an incident angle of the first excitation light to the second surface is 55° or less.

5. The light source device according to claim 1, further comprising a second excitation source emitting a second excitation light having directivity to the wavelength conversion material through the second surface, wherein the first excitation light and the second excitation light are at least partially overlapped with the wavelength conversion material.

6. The light source device according to claim 5, wherein an angle between the c-axis and an optical axis of the first excitation light is different from an angle between the c-axis and an optical axis of the second excitation light.

7. The light source device according to claim 5, wherein an angle between an optical axis of the first excitation light and an optical axis of the second excitation light is 80° or more and 100° or less when viewed from a direction perpendicular to the second surface.

8. The light source device according to claim 1, comprising a dichroic film between the sapphire plate and the wavelength conversion material, transmitting the excitation light and reflecting the wavelength conversion light emitted from the wavelength conversion material.

9. The light source device according to claim 1, comprising an anti-reflection film on the second surface of the sapphire plate to reduce a reflectance of the excitation light.

10. A lighting device comprising a light source device according to claim 1 and a light guide member.

* * * * *